United States Patent [19]

Ayabe

[11] 3,966,881

[45] June 29, 1976

[54] METHOD OF MAKING A SINGLE CRYSTAL INTERMETALLIC COMPOUND SEMICONDUCTOR

[75] Inventor: Masaaki Ayabe, Yokohama, Japan

[73] Assignee: Sony Corporation, Tokyo, Japan

[22] Filed: May 3, 1973

[21] Appl. No.: 356,949

[30] Foreign Application Priority Data

May 11, 1972 Japan.................................. 47-46629

[52] U.S. Cl............................. 423/299; 156/616 A; 75/134 T
[51] Int. Cl.².......................................... C01B 25/00
[58] Field of Search........................... 423/115, 299; 23/301 SP, 294, 273 R, 273 SP; 148/1.6; 252/62.3 GA; 104/42; 75/134 T

[56] References Cited
UNITED STATES PATENTS

| 2,985,519 | 5/1961 | Kelemen | 148/1.6 |
| 3,582,287 | 6/1971 | Capita | 148/1.6 |
| 3,615,203 | 10/1971 | Kaneko et al. | 148/1.6 |
| 3,628,998 | 12/1971 | Blum et al. | 23/301 SP |
| 3,642,443 | 2/1972 | Blum et al. | 23/301 SP |
| 3,694,166 | 9/1972 | Kyle | 23/294 |
| 3,771,970 | 11/1973 | Hemmat et al. | 23/301 SP |

Primary Examiner—Oscar R. Vertiz
Assistant Examiner—Eugene T. Wheelock
Attorney, Agent, or Firm—Hill, Gross, Simpson, Van Santen, Steadman, Chiara & Simpson

[57] ABSTRACT

A method of making a single crystal intermetallic compound semiconductor which includes growing a single crystal in a crucible while maintaining the extent of the melt beyond the growing surface of its single crystal substantially constant during growth.

5 Claims, 10 Drawing Figures

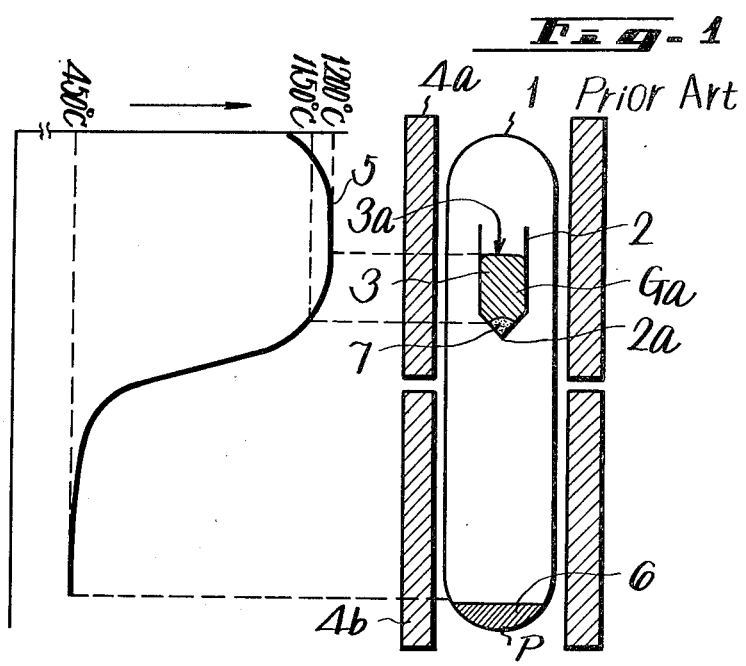
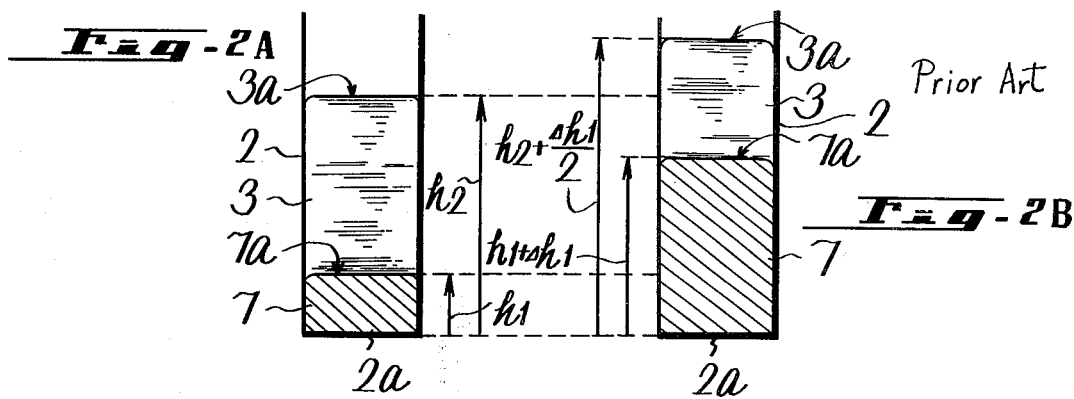
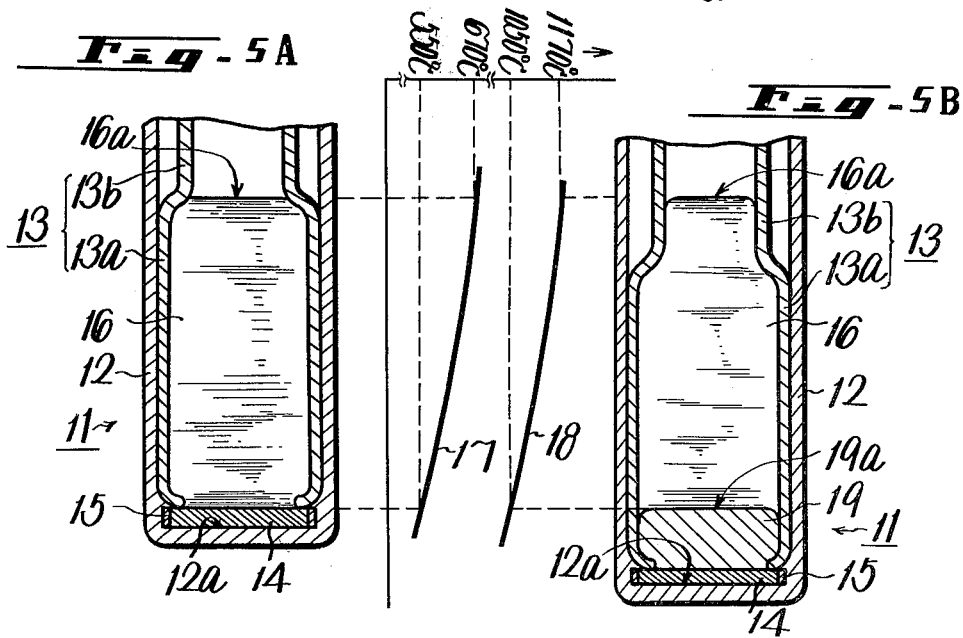

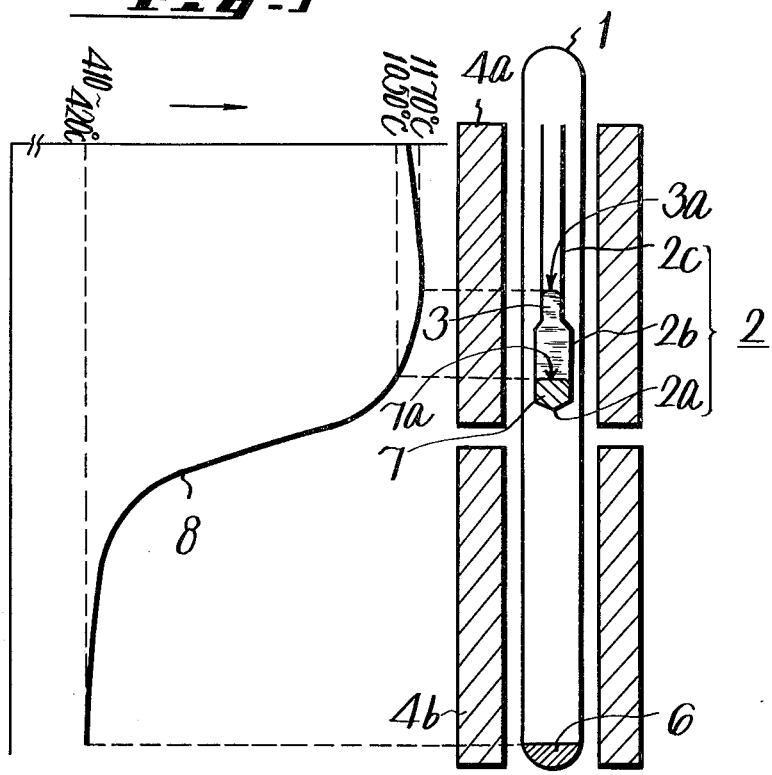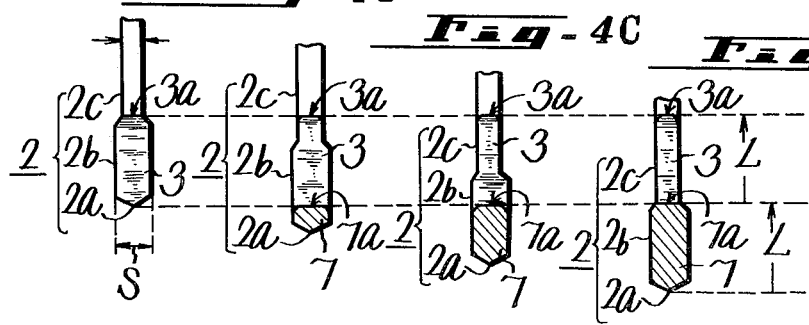

METHOD OF MAKING A SINGLE CRYSTAL INTERMETALLIC COMPOUND SEMICONDUCTOR

BACKGROUND OF THE INVENTION

1. Field of the Invention

This invention relates generally to a method of making groups III-V single crystal semiconductors, and more particularly to a method of making a single crystal intermetallic compound by means of vapor diffusion of a metalloid into a melt of a metal using a crucible.

2. Description of the Prior Art

In U.S. Pat. No. 3,615,203 issued Oct. 26, 1972, the assignee of which is same as that of this application, there was disclosed a method of making a single crystal intermetallic compound. With this method, it requires no high temperature and high pressure so that a single crystal intermetallic compound superior in characteristic and uniform in diameter can be manufactured with a simple construction of device.

According to this method, however, there is a likelihood that a plurality of single crystals are made instead of one single crystal. In case the ingot of an intermetallic compound so manufactured is sliced to provide a wafer and a plurality of light emitting diodes are provided from the wafer, there may not be a problem. However, the plurality of light emitting diodes tend to vary in their characteristics and, especially, in the case where a monolithic alpha numeric character diplay device is formed, it is necessary that one single crystal is used therefor.

In U.S. Pat. No. 3,366,454 issued Jan. 30, 1968, a method is described for allegedly forming a single crystal in a crucible which is caused to move during the formation of the crystal. Here as in U.S. Pat. No. 3,615,205 the extent of the melt beyond the crystal-melt interface varies during the process and the formation of a single crystal only is not assured.

SUMMARY OF THE INVENTION

It is a main object of this invention to provide a method of making an intermetallic compound which improves a growth of a single crystal by keeping the extent of the melt of metal beyond the crystal-melt interface during a crystal growth substantially constant.

It is a further object of this invention to provide a method of making an intermetallic compound which improves and assures the growth of a single crystal by keeping the temperature difference between the surface of melt of metal in the crystal growth and the surface of the crystal substantially constant.

The additional and other objects, features and advantages of this invention will be more clear from the following description taken in conjunction with the accompanying drawings.

BRIEF DESCRIPTION OF THE DRAWINGS

FIG. 1 is a cross-sectional view of a device used in a method for making a conventional intermetallic compound;

FIGS. 2A and 2B are cross-sectional views showing the state in the crucible used in the device depicted in FIG. 1;

FIG. 3 is a cross-sectional view of a device used in a method of making an intermetallic compound according to this invention;

FIGS. 4A, 4B, 4C, and 4D are cross-sectional views showing the state in the crucible used in the device depicted in FIG. 3; and FIGS. 5A and 5B are cross-sectional views of another example of crucible used in a method for making an intermetallic compound according to this invention, especially for showing the specific construction of the crucible and the state therein.

DESCRIPTION OF THE PREFERRED EMBODIMENT

Before describing this invention, a brief description will be given on the manufacture of gallium phosphide by the process described in U.S. Pat. No. 3,615,203.

FIG. 1 shows a device used for carrying out the method of making a single crystal intermetallic compound according to this prior U.S. Pat. No. 3,615,203.

In the drawing, reference numeral 1 indicates a vacuum container composed, for example, of quartz. A crucible 2 formed of quartz is located in the container 1 at the upper portion thereof. The crucible 2 shown in the drawing is generally conical in shape and has a pointed lower end 2a as shown in the drawings. The relatively low vapor pressure material, gallium in the example given, is fused in the crucible 2 to provide a melt 3. A supply of red phosphorous 6 is placed at the bottom of the vacuum container 1. Heating of the gallium and of the phosphorous may be conducted independently by providing separate electric furnaces 4a and 4b, respectively for each of the two materials. The temperature of the upper surface 3a of the molten gallium is held, for example, at about 1,200°C. which is below the melting point of the desired intermetallic compound, gallium phosphide. The temperature at the lower end 2a of the crucible 2 is held at a temperature which is lower than that of the upper end by 20° to 300°C. Typically, the temperature at the lower end 2a is about 1,150°C.

The temperature of the phosphorous 6 is such that it has a vapor pressure which exceeds the decomposition pressure of the gallium phosphide to be produced. As shown in the graph which forms part of the figure, the temperature of the phosphorous may be about 450°C, while the temperature of the molten gallium may range from 1,150°C. near the bottom of the crucible 1,200°C. at the top of the crucible.

Since phosphorous boils at about 280°C., there will be a very substantial vapor pressure of phosphorous existing in the enclosure, and the phosphorous vapors will diffuse into the molten gallium through the exposed upper surface 3a to form the compound gallium phosphide. The resulting intermetallic compound diffuses into the fused gallium toward the lower temperature portion, that is, the lower end 2a of the crucible 2 where gallium phosphide is reduced in the form of a single crystal 7. Continued application of heat causes further diffusion and growth of the single crystal so that formation of the crystal and growth occur in the same operation.

The above mentioned method according to the U.S. Pat. No. 3,615,203 needs a device of simple construction as compared with the prior art since it does not need a relatively high temperature, and hence a gallium phosphide crystal is less contaminated with an impurity. Accordingly, this method may produce an ingot of gallium phosphide with a constant diameter. However, this method has the defect that ingot of gallium phosphide made according to this method has less possibility that it is a single crystal form its lower end (at initial growth) to its upper end. This may be caused from the fact that the growth condition of gallium phosphide is not kept constant.

If the gallium (Ga), which is melted in the crucible 2 with phosphor (P) diffused therein, is replaced with or approximated with a pure gallium (Ga), the atomic mass and density of the gallium (Ga) and the single crystal of gallium phosphide (GaP) are expressed as follows:

Atomic weight of Ga: 70
Density of Ga: 5.5g/cm$^3$
Atomic weight of GaP: 101
Density of GaP: 4g/cm$^3$ Accordingly, if the crucible 2 with the cross-sectional area of 1 cm$^2$ is employed, the phosphor (P) diffuses into the molten gallium (Ga) (gallium melt 3) and gallium phosphide (GaP) 7 grows from the lower end 2a of the crucible 2 as shown in FIG. 2A. The continuation growth of gallium phosphide 7 in the melt 3 of gallium (Ga) causes the change of the height $h_1$ of gallium phosphide (GaP) in the crucible 2 from its bottom to the upper surface 7a of the crystal 7 into $h_1 + \Delta h_1$ as shown in FIG. 2B which will cause the change of the upper surface or the reaction surface 3a of the gallium melt 3 from $h_2$ into about $$h_2 + \frac{\Delta h_1}{2}.$$

This change is caused by the fact that 1 cm$^3$ of gallium 3 is reacted with phosphor (P) to form gallium phosphide crystal of $$1 \times 5.5 \times \frac{101}{70} \div 4 = 2.14 \text{ cm}^3,$$

or about 2 cm$^3$.

Accordingly, with the method described in connection with FIG. 1, as the crystal 7 of gallium phosphide (GaP) is formed, the depth of gallium melt changes with the result that at least one of the temperatures at the upper surface 7a of the crystal 7 of gallium phosphide (GaP) and the temperature at the upper surface or the reaction surface 3a of gallium melt 3 changes. This fact may be one of the reasons that the crystal 7 obtained by this method seldom becomes a single crystal.

FIG. 3 shows an example of the device for practicing the method of this invention. In FIG. 3 references similar to those of FIG. 1 represent similar components and hence their description may be omitted for the sake of brevity.

It should be understood that other intermetallic type semiconductors such as gallium arsenide, indium phosphide, indium arsenide and the like may be made by process of the present invention.

In the example of FIG. 3, the vacuum container 1 has located therein the crucible 2 as in the case of FIG. 1. Separate electric furnaces 4a and 4b are provided around the vacuum container 1 with the crucible 2 therein. A curve 8 in the graph of FIG. 3 shows the temperature distribution in the vacuum container 1 along its longitudinal axis.

The crucible 2 used in this device has a specific configuration such that if the height of finally obtained gallium phosphide single crystal (ingot) is assumed as L, the crucible 2 has a portion 2b from its lower end 2a up to the height L (the cross-sectional area of the portion 2b being taken as S) and a portion 2c of a predetermined length above the portion 2b (the cross-sectional area of the portion 2c being taken as about ½ S) as shown in FIGS. 3 and 4. The reason why the ratio of the cross-sectional areas of the portions 2a and 2c of the crucible 2 is selected as above is that the gallium phosphide crystal 7 of approximately 2cm$^3$ is produced by the gallium 3 of 1 cm$^3$. Accordingly, if the components A and B of a compound crystal AB are replaced with substances other than gallium (Ga) and phosphor (P), the ratio of the cross-sectional areas of the portions 2a and 2c of the crucible 2 must be varied.

FIGS. 4A, 4B, 4C and 4D show the state of gallium phosphide crystal 7 and gallium melt 3 in the crucible 2 in the order of FIGS. 4A to 4D when the crucible 2 is lowered with respect to the electric furnaces 4a and 4b in accordance with the growth of gallium phosphide 7. FIG. 4A shows the first state in which the gallium 3 is placed in the portion 2b of the crucible 2 up to the level or height L from its lower end 2a. On the other hand, FIG. 4D shows the final state in which the gallium phosphide crystal 7 is formed in the portion 2b of the crucible 2 up to the height L from its lower end 2a and the formation or growth of the gallium phosphide crystal 7 is stopped at that height L. FIGS. 4B and 4C show the states between them.

As apparent from FIGS. 4A to 4D, during the growth of the gallium phosphide crystal 7 the length of the gallium melt 3 above the gallium phosphide crystal 7 is always kept at height L. Accordingly, if the crucible 2 is lowered with respect to the electric furnaces 4a and 4b in accordance with the grown speed of the gallium phosphide 7 in the crucible 2, the temperature distribution between the upper surface 3a of the gallium melt 3 and the upper surface 7a of the gallium phosphide crystal 7 can be kept substantially constant.

If an example of the crucible 3 with the circular portion 2b of 20 mm. in diameter, the circular portion, 2c of 14 mm. in diameter and the length longer than 30 mm. is employed and the growth of gallium phosphide (GaP) is carried out under the temperature condition shown in FIG. 3, a gallium phosphide crystal of 26 mm. in height can be formed in 2 weeks.

In this example, the crucible 2 is lowered during the growth of gallium phosphide crystal to keep the temperature inclination between the upper surface 3a of the gallium melt 3 and the upper surface 7a of the gallium phosphide crystal 7 substantially constant. However, when the crucible 2 is kept at fixed position substantially same result can be obtained by controlling the furnace temperature to maintain the depth of melt substantially constant. Here, however, the probability growing the gallium phosphide as a single crystal is slightly lowered.

When the gallium melt 3 is kept substantially constant in depth during the growth of the gallium phosphide crystal, variation of the grown speed of the gallium phosphide crystal is less and any impurity included in the gallium melt seldom appears in solid state, whereby the gallium phosphide crystal easily becomes a single crystal.

The above description is based on a process in which no seed is employed to grow a gallium phosphide single crystal. However, it is ascertained that if a seed is used to grow a single crystal, more superior result can be obtained.

FIGS. 5A and 5B show a further example of device used for carrying out the method of this invention, especially only a crucible 11 used in the device for carrying out the method of this invention with a seed because the other components of the device used therein are substantially same as those used in the example of FIG. 3. The crucible 11 consists of an outer crucible member 12 with the diameter substantially equal along its length and an inner crucible member 13 the outer diameter of one part of which is approximately the same as the inner diameter of the outer crucible member 12. The inner crucible member 13 has a larger diameter portion 13a which is equal to the inner diameter of the member 12 and a smaller diameter portion 13b as in the case of the crucible 2 shown in FIGS. 3 and 4, but has no bottom. On the bottom 12a of the outer crucible member 12 there is placed, for example, a disc shape gallium phosphide single crystal seed 14 of about 3 mm. thickness and the inner crucible member 13 is inserted into the outer crucible member 12 to fix the single crystal seed 14. Reference numeral 15 indicates a quartz ring used to position the single crystal seed 14.

FIG. 5A shows the state of the crucible 11 at the start of the reaction therein, while FIG. 5B shows the state of the crucible 11 at the mid way of the reaction therein.

Gallium melt 16 charged into the inner crucible member 13 is preferred to be mixed with therein a small amount of gallium phosphide, for example, about 50 gr. of a gallium phosphide per about 50 gr. of gallium melt so as to prevent melting of the crystal seed 14.

As to temperature, it is desired that the temperature be gradually raised from the temperature shown by a curve 17 to that shown by a curve 18 in the graph associated with and made a part of FIG. 5A and 5B, as in the case of FIG. 3. The time for this temperature variation is selected to be in the order of 20 hours, by way of example. Although it is not shown in FIG. 5, the heating temperature of red phosphor is selected to be from 410 – 420°C from the first.

When the temperature of the crucible 11 reaches that shown by the curve 18, gallium phosphide 19 is grown on the crystal seed 14. If, in order to keep the temperature inclination of the crucible 11 between the upper surface 19a of the gallium phosphide 19 and the upper surface 16a of the gallium melt 16 as in the case of the foregoing example, the crucible 11 is lowered in accordance with the grown speed of the gallium phosphide 19, a single crystal of gallium phosphide is obtained.

In the above examples, the gallium melt is kept substantially constant in depth during the growing process of the gallium phosphide by employment of a specific configuration of crucible. However, it is also ascertained that the same general effect can be also obtained by adding gallium melt to the inner crucible member 13 from the outside as a function of the grown speed of gallium phosphide.

It may be apparent that a number of variations and modifications can be effected without departing from the scope and spirit of the novel scopes of this invention.

I claim as my invention:

1. A method of making an intermetallic compound semiconductor composed of a first element from Group III having a relatively low vapor pressure at the melting point of said compound and a second element from Group V having a relatively high vapor pressure at said melting point which comprises the steps of melting said first element in a confined zone, applying a temperature differential along the melted first element between 20°C and 300°C, while maintaining said melted mass at a temperature below the melting point of the desired intermetallic compound, vaporizing said second element in the confined zone, maintaining a depth of said melted mass of said first element substantially constant, and exposing the higher temperature portion of said melted mass to the vapors of said second element to thereby form a single crystal of said intermetallic compound at a lower temperature portion of said zone.

2. A method of making an intermetallic compound semiconductor according to claim 1, wherein said higher and lower temperature portions are kept at substantially constant temperature.

3. A method according to claim 1, in which the Group III element is melted and the depth of said melted mass is maintained in a crucible.

4. A method according to claim 3, in which the crucible is disposed in a furnace whose temperature decreases from top to bottom and in which the crucible is gradually lowered to maintain the temperature of the upper end of the single crystal substantially constant.

5. A method according to claim 3, in which the crucible is necked in at a height from its bottom which corresponds to the depth of the melt at the beginning of the growth process.

* * * * *